(12) United States Patent
Mehta

(10) Patent No.: US 6,197,638 B1
(45) Date of Patent: *Mar. 6, 2001

(54) OXIDE FORMATION PROCESS FOR MANUFACTURING PROGRAMMABLE LOGIC DEVICE

(75) Inventor: Sunil D. Mehta, San Jose, CA (US)

(73) Assignee: Vantis Corporation, Sunnyvale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/227,981

(22) Filed: Jan. 8, 1999

Related U.S. Application Data

(63) Continuation-in-part of application No. 08/699,401, filed on Aug. 19, 1996, now Pat. No. 5,960,274.

(51) Int. Cl.[7] .............................................. H01L 21/8247
(52) U.S. Cl. ..................... 438/258; 438/211; 438/264; 438/981
(58) Field of Search .................................. 438/257–267, 438/211, 98

(56) References Cited

U.S. PATENT DOCUMENTS 5,830,795  11/1998  Mehta et al. .

5,960,274  * 9/1999  Mehta ............................... 438/211

OTHER PUBLICATIONS

"Inside AMD's CMOS PLD Technology," PLD DAtabook, AMD, 1993.

U.S. application No. 09/232,061, Fong et al., filed Jan. 15, 1999.

* cited by examiner

*Primary Examiner*—Richard Booth
(74) *Attorney, Agent, or Firm*—Fliesler, Dubb, Meyer & Lovejoy LLP

(57) ABSTRACT

A method of providing oxide layers at the surface of the semiconductor substrate suitable for use with the formation of programmable logic devices. The method comprises the steps of: depositing a layer of nitride on the surface of the semiconductor substrate; etching a first and second portions of the nitride layer; forming a first and second regions of a first oxide layer on the substrate in the first and second etched portions of the nitride layer; etching a the first region of the oxide; forming a second oxide layer on the substrate having a first portion in the first etched portion of the nitride and a second portion overlying the first portion of the second region of the first oxide layer; removing the nitride layer; and forming a third layer of oxide having a first portion on the surface of the substrate, a second and third portions on the first and second portions of the second oxide layer.

34 Claims, 8 Drawing Sheets

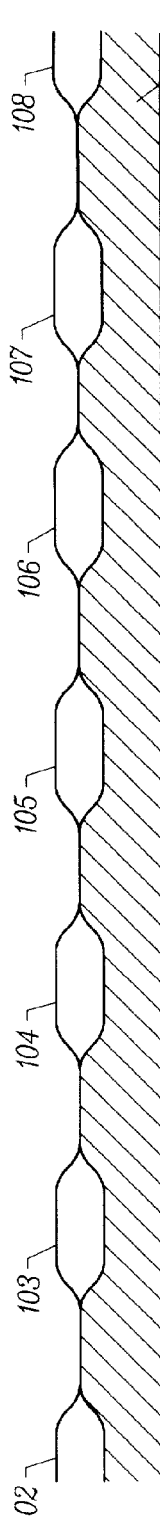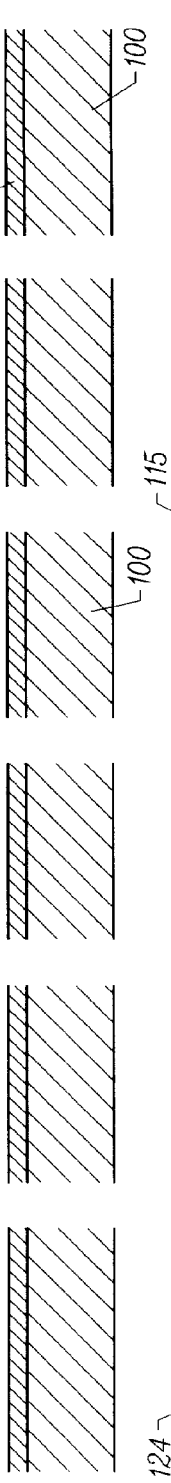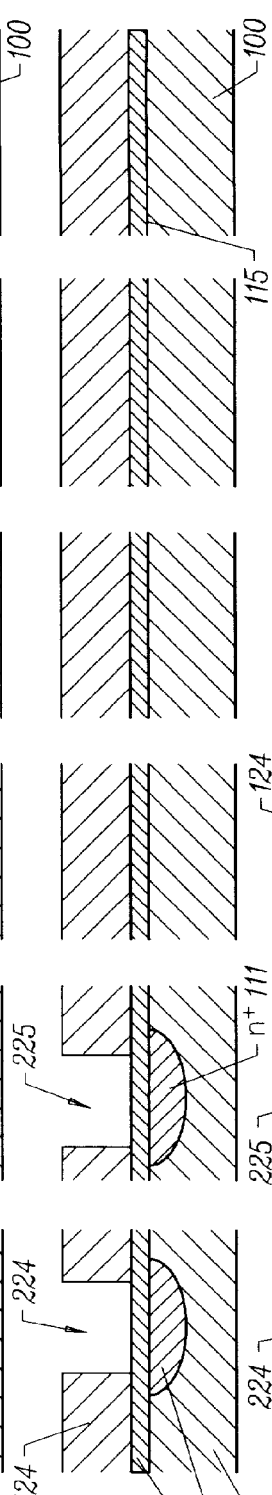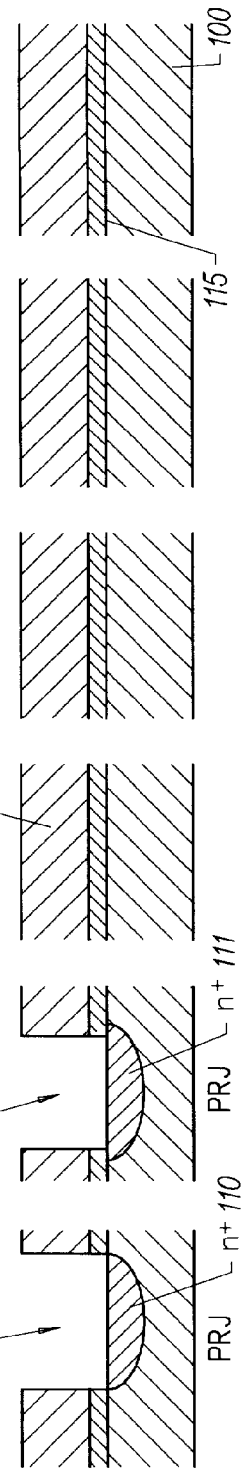

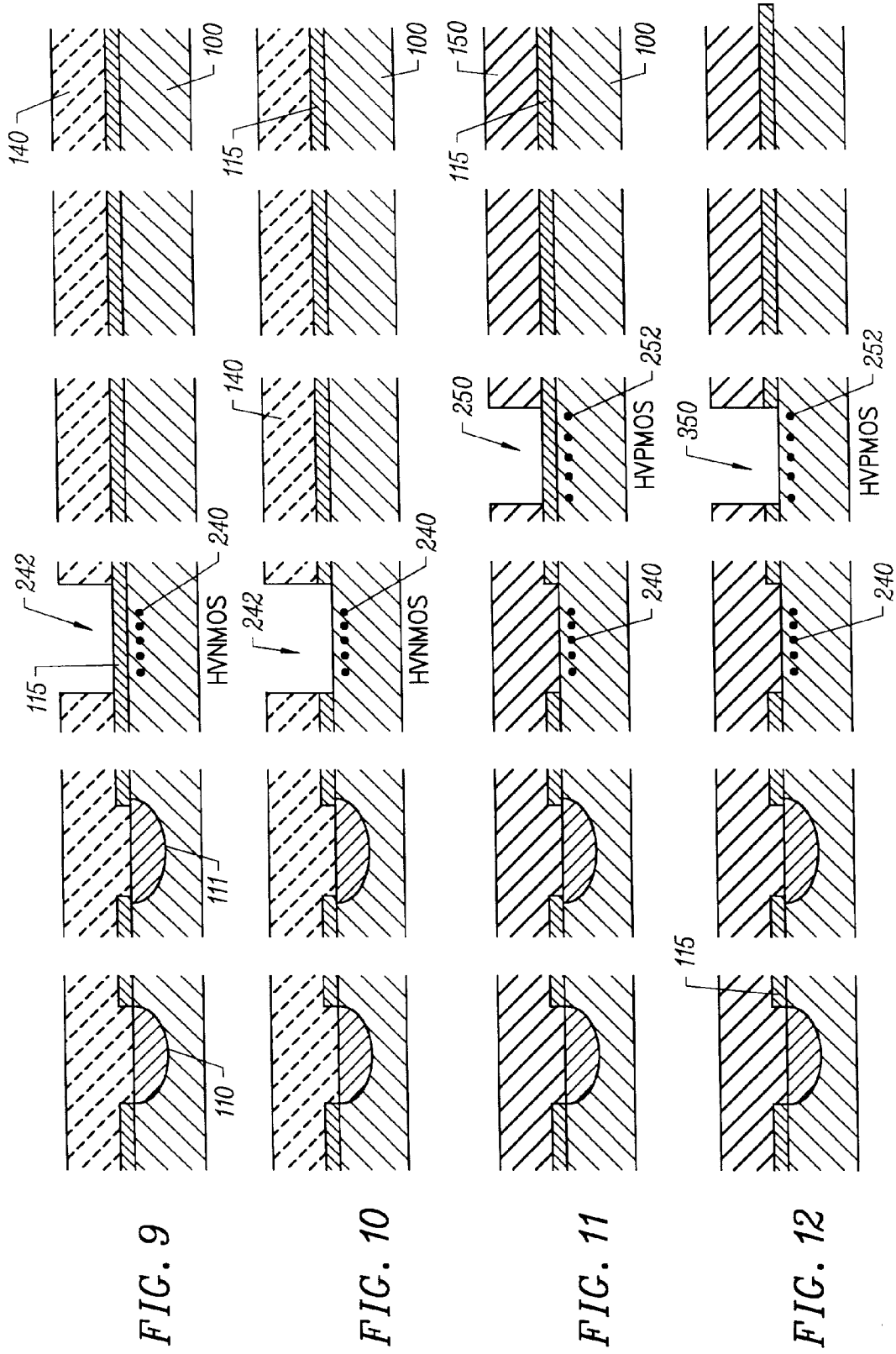

OXIDE FORMATION PROCESS FOR MANUFACTURING PROGRAMMABLE LOGIC DEVICE

CONTINUING APPLICATION DATA

This application is a continuation-in-part of Application Ser. No. 08/699,401, filed Aug. 19, 1996, Inventor Sunil D. Mehta now U.S. Pat. No. 5,960,274.

BACKGROUND OF THE INVENTION

1. Field of the Invention

The invention relates to methods of making programmable logic devices, and specifically electrically erasable programmable logic devices having a number of different transistor types on a single substrate.

2. Description of the Related Art

Programmable logic devices (PLD) are circuits which can be configured by a user to perform logic functions. Generally, PLDs include a programmable array of cells and array control circuitry which is utilized to program the array with the desired implementation. The programmable array comprises a series of low-voltage, short channel floating gate transistors which store charge to reflect whether a particular cell is programmed with a bit of data. The programmed array reflects in a particular user's individual configuration for the programmable device, allowing users to customize the programmable logic device for a number of different applications.

One type of programmable logic device which has become popular due to its performance and cost characteristics are electrically erasable ($E^2$) CMOS programmable devices.

Erasable CMOS technology is based on the concept of a stored charge on a floating gate. Electrons are transferred to the gate through a physical mechanism known as Fowler-Nordheim tunneling. For an electrically erasable cell, a tunnel oxide is present between the source and drain regions and the floating gate that is about one-third of the thickness of a traditional transistor gate oxide. Fowler-Nordheim tunneling involves placing a potential across the tunnel oxide which distorts the electric field and allows electrons to traverse the tunnel oxide upon which they become trapped on a floating gate.

A schematic representation of an prior art programming cell in a programmable logic device is shown in FIG. 1. FIG. 2 shows a semiconductor cross-section of the programming cell shown in FIG. 1. The control circuitry of the cell—the program transistors—essentially comprise high voltage transistors capable of sustaining high electric fields. As shown in FIG. 2, the read transistor, which operates at low voltage, includes a first junction 10, second junction 12 and gate 14, (defined by the word line), which is separated from the first and second junctions by oxide layer 20. Oxide layer 20 has a thickness of approximately 150A. Program transistor 32 includes a first junction 16, second junction 18 and a gate 142 which also rests on oxide layer 20. Floating gate 40 is separated from program junction 18 by tunnel oxide 22 which may be activated by control gate 24, which has an underlying oxide thickness of about 180 Å. The thickness of tunnel oxide 22 is in a range of approximately 80–100 Å.

When programming or erasing the device, a voltage is applied between the program and control gate nodes. The direction of the voltage determines whether the cell is erased or programmed. When erasing, the control gate is given a positive voltage and the program node is grounded. When programming, the program node voltage is elevated and the control gate is grounded.

It should be generally recognized that several alternative designs of memory cells may be utilized. Characteristically, in an $E^2$ CMOS PLD, four types of transistors are required: high voltage P channel, high voltage N channel, low voltage P channel, and low voltage N channel. Techniques for saving mask steps during the formation of these cells are advantageous as each mask savings reduces the cost of the overall device.

The trend of E PLD devices has been toward lower and lower supply voltages. Consequently, this has required a corresponding scaling down of the gate oxide and two different oxide thicknesses for the gate and tunnel oxides. As the gate oxide thicknesses have been scaled down, they have begun to approach the thickness of the tunnel oxide on lightly or undoped silicon.

Traditionally, the manufacturing process for implementing all four types of cells requires a large number of sequential process steps. Generally, four separate masking steps were required to complete the formation of the tunnel regions and overlying oxides for the four different types of devices.

U.S. patent application Ser. No. 08/664,190 discloses a scheme for reducing the number of masks required for forming the transistors from four to three. The benefit of this is the savings of a mask step, but the process contemplates that the thickness of the tunnel region mask and either the n-channel or p-channel low voltage transistor will be roughly the same. If different oxide thicknesses are desired for the tunnel region and programming and the low voltage transistor, this method is of limited utility. What is required is a method which is capable of allowing flexibility in the formation of oxides for $E^2$ PLD devices with a minimum number of mask steps.

SUMMARY OF THE INVENTION

The invention, briefly described, comprises a process for forming a plurality of CMOS transistors on a semiconductor substrate, wherein the plurality of transistors includes high-voltage N-channel and high-voltage P-channel transistors, and low-voltage N-channel and low-voltage P-channel transistors, wherein a tunnel oxide of a first thickness is required and a gate oxide of a second thickness is required. The formation of multiple oxide regions of varying thicknesses is supported by the method of the present invention.

In accordance with the present invention, a method of providing oxide layers on the surface of a semiconductor substrate is provided. The method comprises the steps of: depositing a layer of nitride on the surface of the semiconductor substrate; etching a first and second portions of the nitride layer; forming a first and second regions of a first oxide layer on the substrate in the first and second etched portions of the nitride layer; etching a the first region of the oxide; forming a second oxide layer on the substrate having a first portion in the first etched portion of the nitride and a second portion overlying the first portion of the second region of the first oxide layer; removing the nitride layer; and forming a third layer of oxide having a first portion on the surface of the substrate, a second and third portions on the first and second portions of the second oxide layer.

BRIEF DESCRIPTION OF THE DRAWINGS

The invention will be described with respect to the particular embodiments thereof. Other objects, features, and advantages of the invention will become apparent with reference to the specification and drawings in which:

FIGS. 4–18 are cross-sectional diagrams of a semiconductor wafer processed in accordance with the method of the present invention.

DETAILED DESCRIPTION OF THE PREFERRED EMBODIMENTS

The invention provides a simpler and more cost-effective process of forming $E^2$ CMOS PLD devices, through the use of a nitride layer during the formation of the high and low voltage p and n channel transistor implant regions. In one embodiment, the invention allows for the formation of six different transistor device types, with three independently controlled oxide thicknesses, using only five mask layers.

In the following description, numerous details, for example, specific materials, process steps, etc., are set forth in order to provide a thorough understanding of the present invention. It will be obvious, however, to one skilled in the art that the specific details need not be employed to practice the present invention. Moreover, specific details of particular processes or structures may not be specifically presented in order not to unduly obscure the invention where such details would be readily apparent to one of average skill in the art.

In particular, because the process of the present invention pertains to only a portion of the complete process required to form an $E^2$ PLD device, only that portion of the process critical to understanding the invention is described. The total amount of process steps required to form an $E^2$ PLD device is, as a whole, known to those of average skill. Hence, for clarity, only that portion of the process directly affected by the invention is illustrated here.

Figure 1:
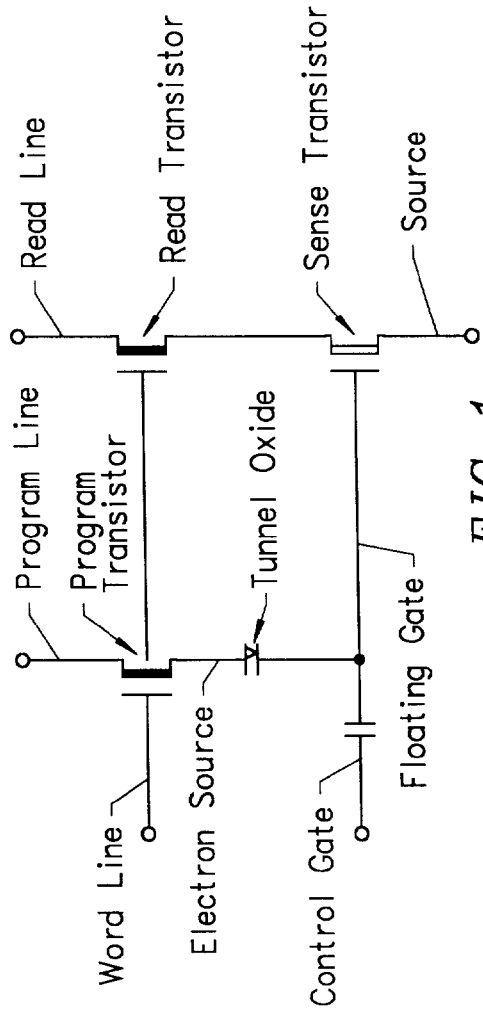
FIG. 1 is a schematic representation of a programming cell and $E^2$ PLD device.
Figure 2:
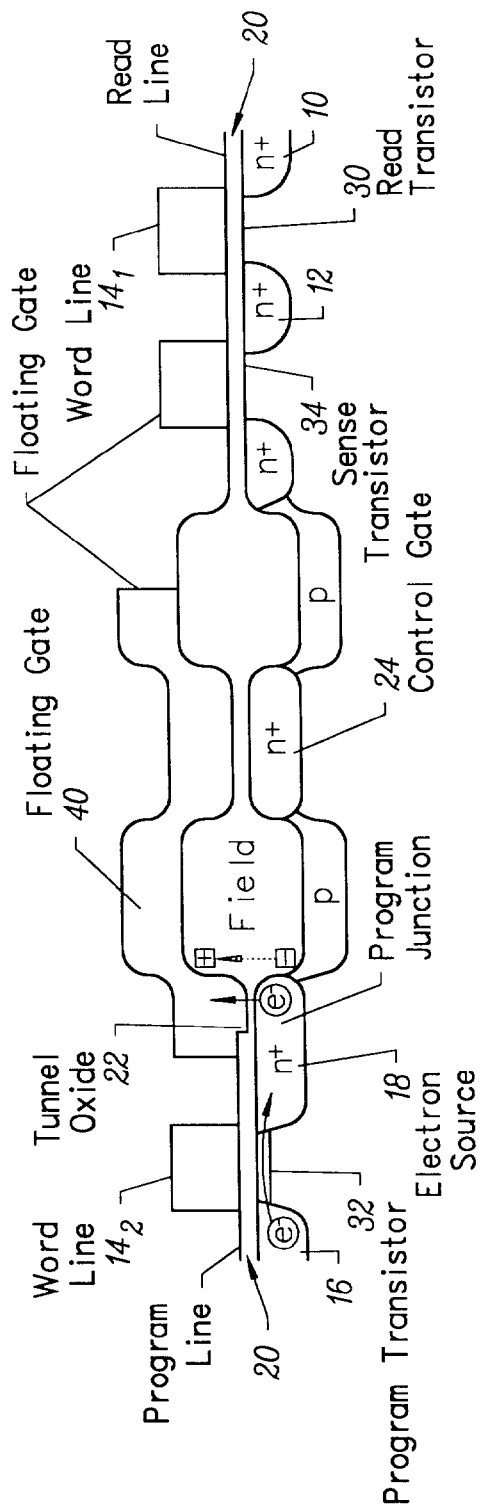
FIG. 2 is a semiconductor cross-section of the pramming cell shown in FIG. 1.
Figure 3:
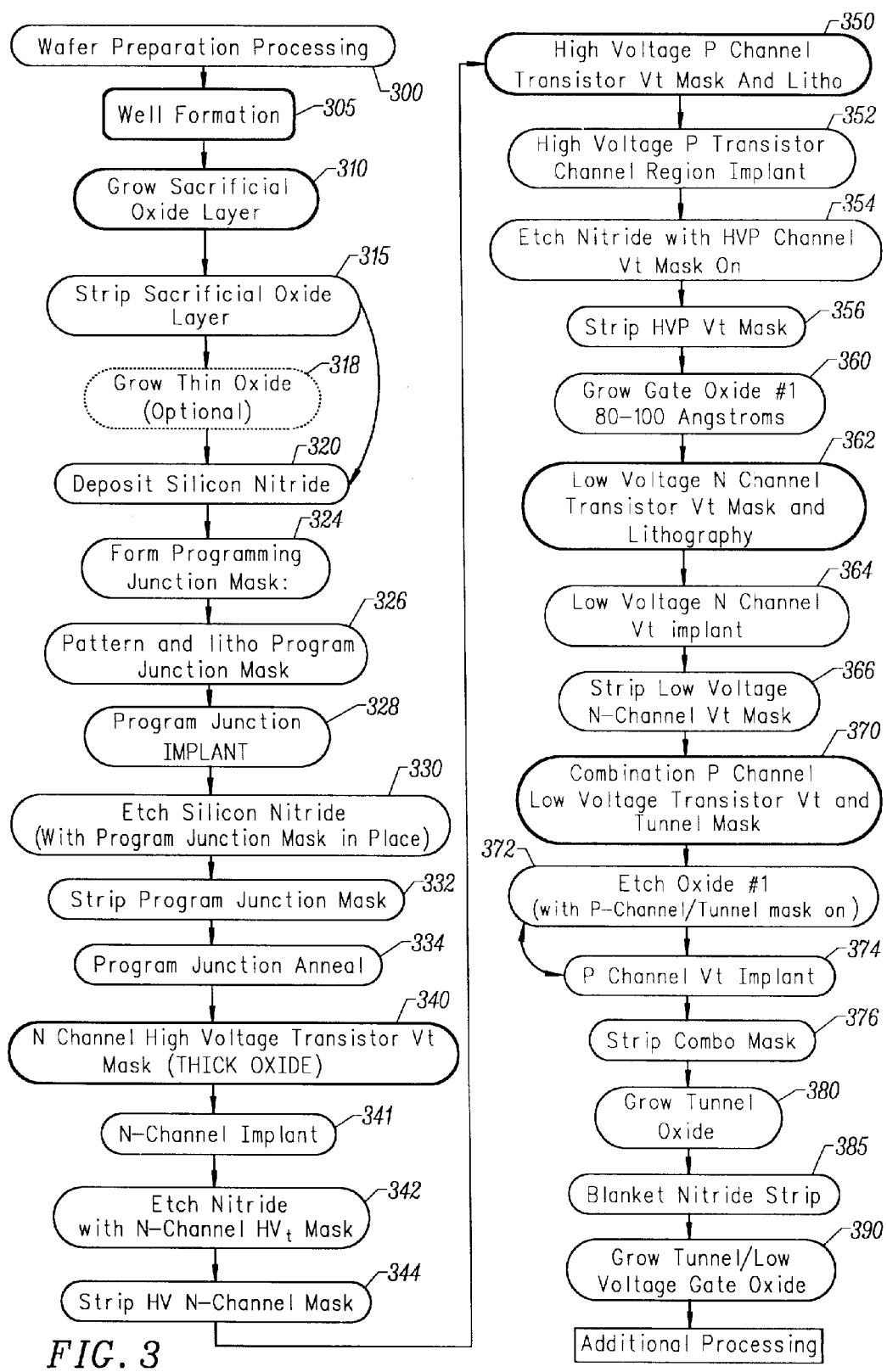
FIG. 3 is a flow diagram of the process of the present invention illustrating the process flow in accordance with the wafer cross-sectional diagrams.

A portion of the conventional process sequence utilized to form the threshold channel implant, gate oxide and tunnel oxide in a cell such as that shown in FIG. 2 is illustrated in FIG. 3. The method of the present invention will be described with repeated reference to FIG. 3 and FIGS. 4–18.

FIG. 4 shows a cross-section of semiconductor wafer 100 in which an $E^2$ programmable logic device utilizing CMOS technology is being formed. As will be recognized by one of average skill in the art, the process flow for preparing an $E^2$ PLD device includes a multitude of detailed processing steps. For example, the structure shown in FIG. 4, including wafer 100 upon which field oxide regions 102-108 have been grown, undergoes a number of pre-growth etching, cleaning and implant steps. It should be recognized by one of average skill in the art that to reach the particular structure shown in FIG. 4, a number of steps are required, as described below.

More specifically, cleaning steps, barrier oxidation steps, and zero level etching steps will have been performed on the substrate 100. This is represented in FIG. 3 as block processing step 300. In addition, as shown in FIG. 3, in the process of forming an $E^2$ PLD device, well implant regions may be provided in substrate 100 in accordance with known techniques. (For example, an implant of boron at $5.6\times10^{12}$ atom/cm.$^2$ at 60 KeV.) Subsequently, source/drain regions, isolated from each other by field oxide regions, will be formed by depositing, for example, a nitride layer of between 1,500 and 1,800 Å on the substrate, forming a source/drain mask over the nitride layer, and etching the nitride layer leaving portions of the layer covering the source/drain regions. It should be recognized that the wells may be formed subsequent to the source/drain pattern etch.

Subsequently, device isolation regions may be formed in the substrate. Such regions are typically formed by so-called shallow trench oxidation or local oxidation of silicon (LOCOS) processes. In a LOCOS process, for example, field oxide regions 102-108 are formed in substrate 100 by placing the substrate in an atmosphere of oxygen with 0.5% HCl at a temperature of about 1,100 to 1,150° Celsius to form oxide regions 102–108 having a thickness of between 3,700 and 4,300 Å. As is well known, the nitride portions remaining on the substrate cover the source/drain regions and prevent field oxidation in these regions.

An etch back is subsequently performed on the field oxide layer and the nitride layer removed leaving source/drain substrate regions remaining between field oxide regions 102–108.

FIGS. 5–18 show the cross-sections of the wafer during processing in accordance with the process of the present invention. In order to simplify the explanation of the invention, the field oxide regions 102–108 are not shown in FIGS. 5–18.

With reference to FIGS. 3 and 5–18, a sacrificial oxide layer (not shown) is then grown at step 310 on the source/drain regions of silicon substrate 100 which remain between field oxide regions 102–108. The sacrificial oxide layer (not shown) is grown by placing substrate 100 in an atmosphere of oxygen and hydrochloride (HCl) at a temperature of 900° C. for about one hour. The sacrificial oxide layer has a thickness of between 200–300 Å. The sacrificial oxide layer is subsequently stripped.

In a unique aspect of the present invention, following formation and stripping of the sacrificial oxide layer at step 315, at step 320, a layer of silicon nitride 115 formed on the surface of substrate 100 by placing substrate 100 in a nitrogen-containing atmosphere at a temperature of 700–900° C. to form layer 115 with a thickness of about 80–200 Å. This is shown in FIG. 5 (with the omission of the field oxide regions 102–108). In an alternative embodiment of the method of the present invention, at step 318 prior to step 320, a thin oxide layer (not shown) may be formed on the surface of substrate 100 to act as a buffer layer and nitride etch stop when layer 115 is removed, at a subsequent point in the process flow. The oxide layer may be formed by thermal oxidation of the silicon substrate in accordance with well-known techniques.

Program junctions 110 and 111 for the tunnel region and control gate, respectively, of the EEPROM cell are subsequently formed at steps 324, 326, and 328. At step 324 (and as shown in FIG. 6), a program junction mask 124 is deposited on the surface of the silicon nitride layer 105 and patterned (FIG. 7) using standard lithography techniques at step 326 to form windows 224,225. Subsequently, at step 328, junction 110 is formed by an implant through the window formed in the program junction mask and through nitride layer 105 by, for example, implanting phosphorous at a dose of $1\times10^{15}$ atoms/cm.$^2$ at an energy of 60 KeV into substrate 100.

Following the program junction implant step 328, the silicon nitride in windows 224,225 (formed for the program junction implants 110,111) is etched at step 330 with the mask 124 in place, as illustrated in FIG. 8. This allows for the surface of the substrate 100 to be exposed for formation of the tunnel and control gate oxides at a subsequent stage of the process of the present invention.

Once the nitride 115 is etched at step 330, the program junction mask layer 124 is stripped at step 332 using, for example, a plasma etch process, and the program junctions annealed at step 334 at a temperature of 900° C. for a period of about 20 minutes.

Following formation of program junctions 110, 111, field implant masking steps, and N-channel and P-channel field implants may be performed in accordance with well-known techniques, if desired. (These implant steps are not illustrated.)

Following the provision of the field implants, high voltage transistor gate threshold voltage implants are performed. These implants allow selection of the gate threshold voltage ($V_t$) for the high voltage transistors formed on substrate 100.

This begins at step 340 with the provision of a high voltage n-channel transistor $V_t$ mask layer 140. Mask layer 140, illustrated in FIG. 9, may comprise a photoresist layer formed in accordance with well-known techniques. Subsequently, the high voltage N-channel $V_t$ implant is performed by, for example, an implant of Boron in a dose of $1.9 \times 10^{12}$ atoms/cm.$^2$ at an energy of about 20 KeV to form an N-type impurity channel region 240 in substrate 100.

Next, at step 342, the nitride layer 115 in window 242 is etched off thereby exposing the surface of substrate 100 (FIG. 10). This will allow selective formation of the gate oxide for the high voltage N-channel transistor, as described below. The high voltage N-channel transistor $V_t$ mask 140 is stripped at step 344.

Following the formation of the high voltage N-channel transistor $V_t$ implant region 240, the high voltage P-channel threshold voltage implants are performed in a similar manner. It should be recognized that the order of formation of the P-channel and N-channel $V_t$ implants is not crucial to the method of the present invention and may be reversed in accordance with the present invention.

At step 350 the high voltage transistor P-channel $V_t$ mask 150 is formed by applying a photoresist layer in accord with well-known techniques over the surface of substrate 100. This mask layer is subsequently patterned using standard lithography techniques to form window 250 as illustrated in FIG. 11. At step 352, a high voltage p-channel $V_t$ implant is made by, for example, an implant of phosphorous in a dose of $4.0 \times 10^{11}$ atoms/cm.$^2$ at an energy of about 55 KeV to form a p-type impurity channel region 252 in substrate 100.

Subsequently, at step 354 (FIG. 12), the nitride layer 115 in window 250 is etched off, thereby exposing the surface of substrate 100. This will allow selective formation of the gate oxide for the high voltage p-channel transistor, as described below. Finally, at step 356, the high voltage p-channel $V_t$ mask is stripped using a sulfuric wet etch process.

At step 360, in the exposed regions of the substrate remaining after the nitride etches, a thin oxide layer 160 is grown, for example, by thermal oxidation of the substrate in an oxygen atmosphere at a temperature of 850–900° C. for a period of 20–30 minutes. The nitride layer 105 acts as a mask layer for growth of the oxide in the selective regions $160_1, 160_2$ over the programming junctions 110,111, respectively, and regions 1603–1604 over high voltage transistor $V_t$ implants 240,252, respectively. Each region has a thickness in the range of 30–150 Å.

Figure 13:
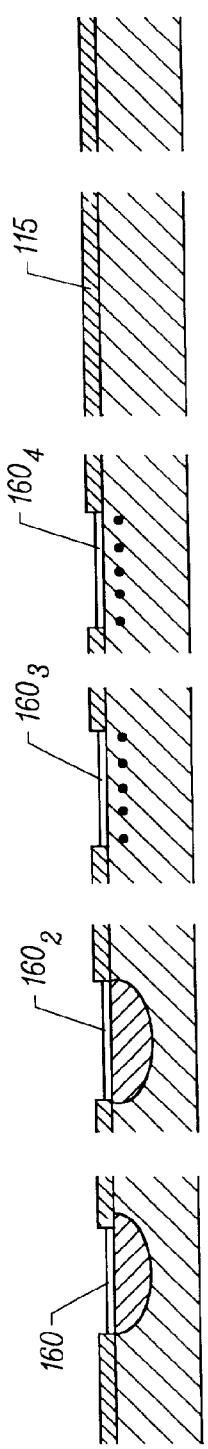

This leaves the structure shown in FIG. 13. The substrate is now ready for formation of the low voltage transistor implants used to select the gate threshold voltage ($V_t$) for the low voltage transistors.

At step 362 (FIG. 14), in accordance with well-known techniques, mask layer 162 is deposited on the surface of substrate 100 and thin oxide layer regions $160_{1-4}$. Mask layer 362 is subsequently patterned using standard photolithography techniques to create a plurality of windows, such as opening 262 over the N-channel to be implanted.

Figure 14:
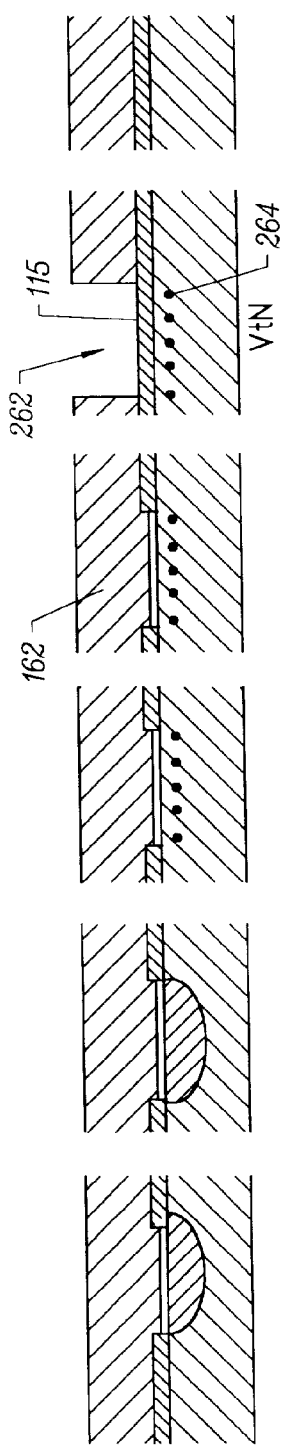

As shown in FIGS. 3 and 14, following lithography of the low voltage N-channel transistor gate threshold mask 262, a low voltage transistor, gate threshold voltage implant (step 364) is performed by implanting an impurity such as boron in a dose of about $6.2 \times 10^{12}$ atoms/cm.$^2$ at an energy of about 20 KeV through nitride layer 115 into the regions of substrate 100 exposed under window 262, thereby forming a region 264 of dopant in the substrate 100.

Following the low voltage N-channel transistor threshold voltage implant 124, at step 366, the low voltage N-channel transistor $V_t$ mask 162 is stripped using, for example, a sulfuric wet etch process.

Figure 15:
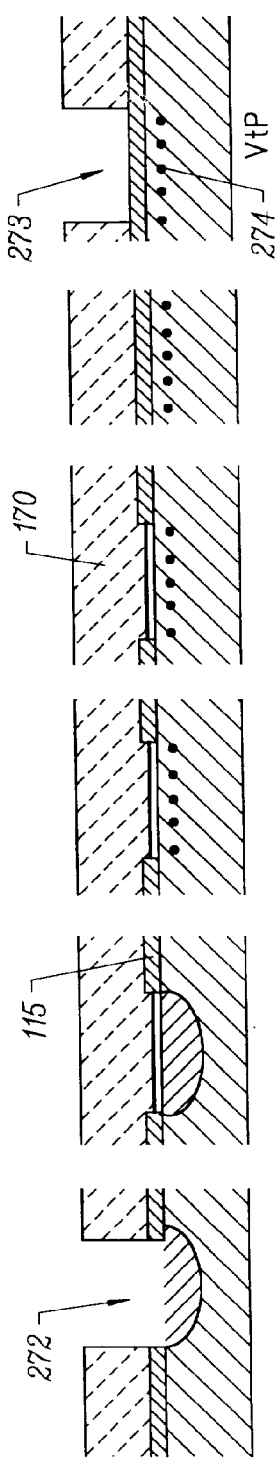

FIG. 15 illustrates sub-steps 370, 372, 374, utilized to perform the low voltage P-channel transistor, gate threshold voltage implant. A low voltage P-channel transistor channel and tunnel region mask 170 is applied to the surface of substrate 100 overlying nitride layer 105. Mask layer 170 is patterned using conventional lithography techniques to provide windows 272,273 overlying the tunnel region 110 and high voltage p-channel region. At step 372, the oxide layer $160_1$ overlying region 110 (in window 272) is etched back exposing the surface of the substrate overlying region 100. In accordance with the present invention, mask layer 170 is used as a mask to etch portions of oxide 1601. Subsequent to (or prior to) step 372, implant of a P-type impurity such as phosphorous in a dose of approximately $5.9 \times 10^{12}$ atoms/cm.$^2$ at an energy of 55 KeV is thereafter performed to form impurity region 274. The ordering of steps 372 and 374 is not critical to the practice of the invention and the ordering may be reversed with the scope of the present invention.

Subsequently, at step 376, mask layer 170 is removed, and wafer 100 is ready for the final oxidation preparation. Hence, prior to the cross-section of the substrate shown in FIG. 16, the nitride layer 115 covers the low voltage transistor channel regions, the first oxide formations cover the high voltage transistor regions and programming junction $160_2$ and program junction region 110 is uncovered.

Figure 16:
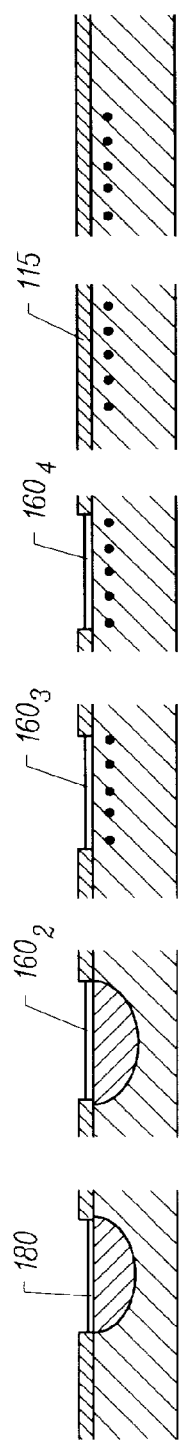
Figure 17:
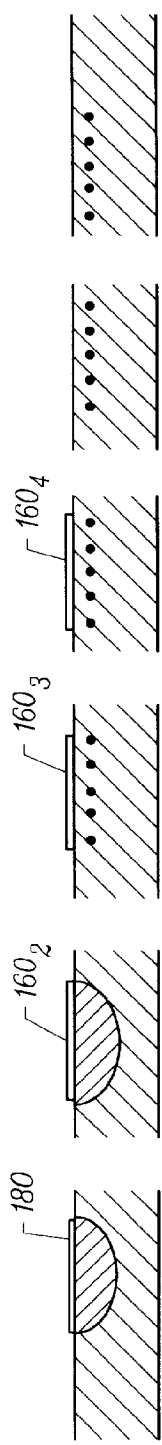

As shown at step 380, a second oxidation step is performed to provide a layer of oxide 180, having a thickness typically in the range of about 20–80 Å, over region 110, and add to the oxide layers $160_{2-4}$ overlying region 111, and the high voltage channel regions 240,252. Hence, as shown in FIG. 16, region $160_2$ has a thickness of 30–120A, regions $160_{3-4}$ have a somewhat thinner thickness of about 30–100 Å, while oxide layer 180 has a thickness of typically about 20–80 Å. The silicon nitride layer 115 prevents formation of the oxide on other areas of the substrate.

At step 385, a blanket strip of the silicon nitride is performed by a phosphoric acid wet etch process. This leaves the structure shown in cross-section in FIG. 17.

Figure 18:
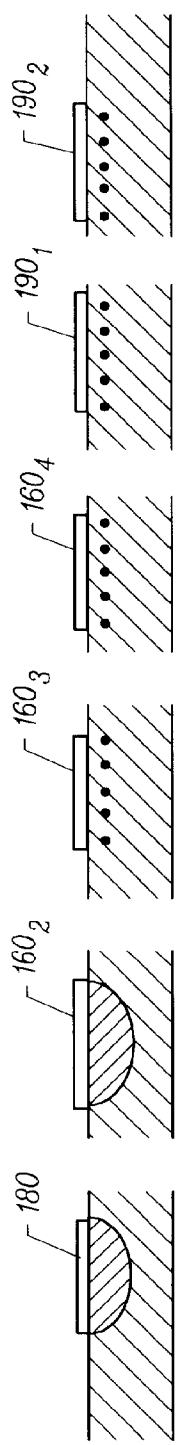

Finally, as shown in FIG. 18, at step 390 a third oxidation step (tunnel/low voltage gate oxide) is used to form low voltage transistor oxides $190_1, 190_2$ having a thickness in the range of about 20–80 Å and add to the existing oxide formations. Due to the differential growth rate variance between oxide growth on silicon and oxide growth on oxide, and the underlying silicon implanted regions over which the oxides are grown, the thickness of each region will vary. For example: region 180 will have a resulting thickness of about 30–120 Å, and typically 90 Å; region $160_2$ will typically be 120–200A (due to differential growth—greater than regions $160_3/160_4$); regions $160_3,160_4$ about 50–200 Å (composite), and typically about 150 Å; and regions $190_1,190_2$ a thickness of about 20–80 Å, and typically about 40 Å.

Figure 19:
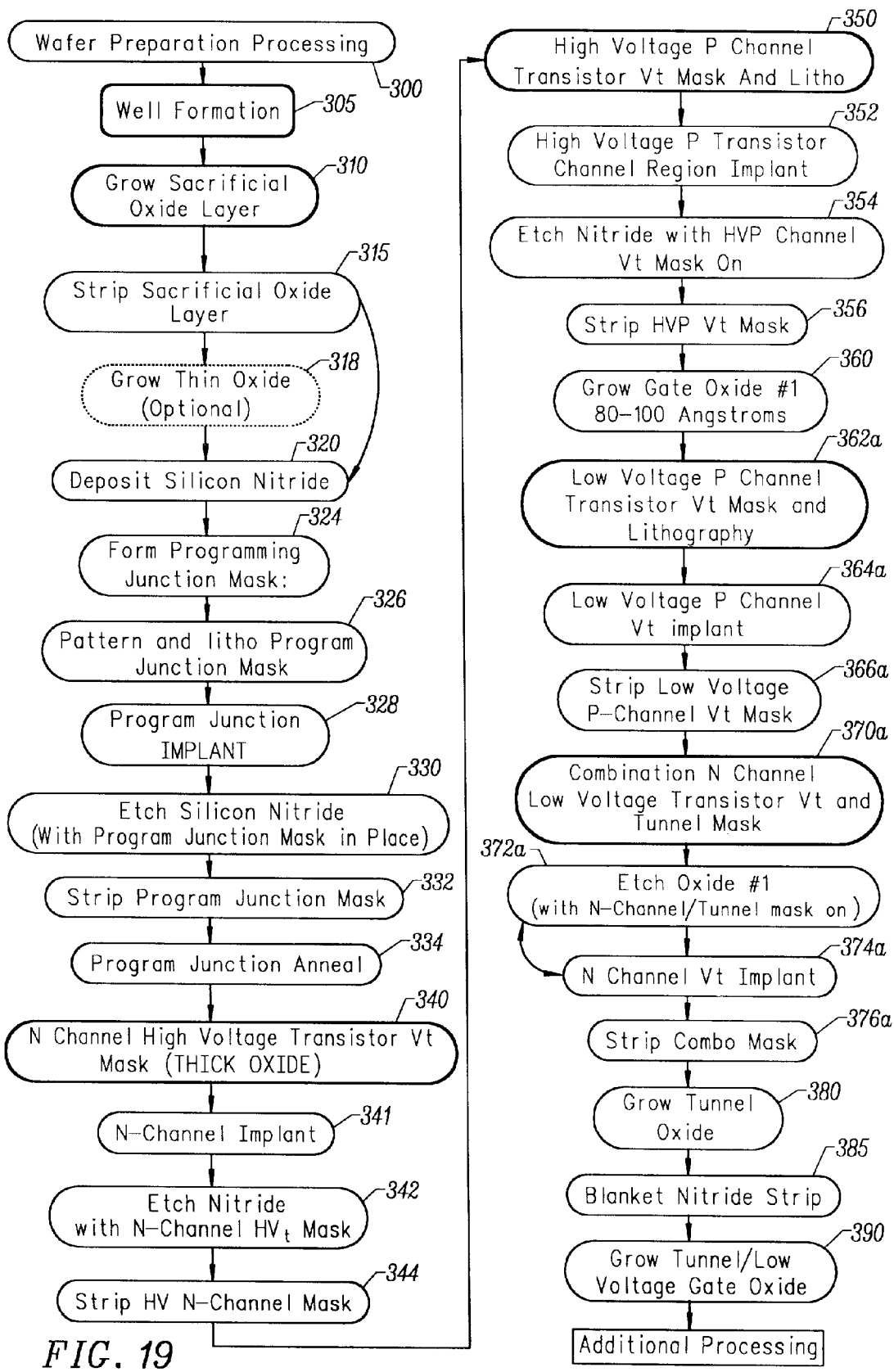
FIG. 19 is a flow diagram of a first alternative embodiment of the process of the present invention.

In a first alternative embodiment of the present invention shown in FIG. 19, the tunnel and low voltage combination mask region formation may be with an N-channel device, rather than a P-channel device. Specifically, in steps 362a, 364a, 366a, 370a, 372a, 374a and 376a, the order of formation of the N- and P-channel low voltage transistors is reversed, and the formation of the low voltage N-channel transistor is combined with the tunnel region mask.

Figure 20:
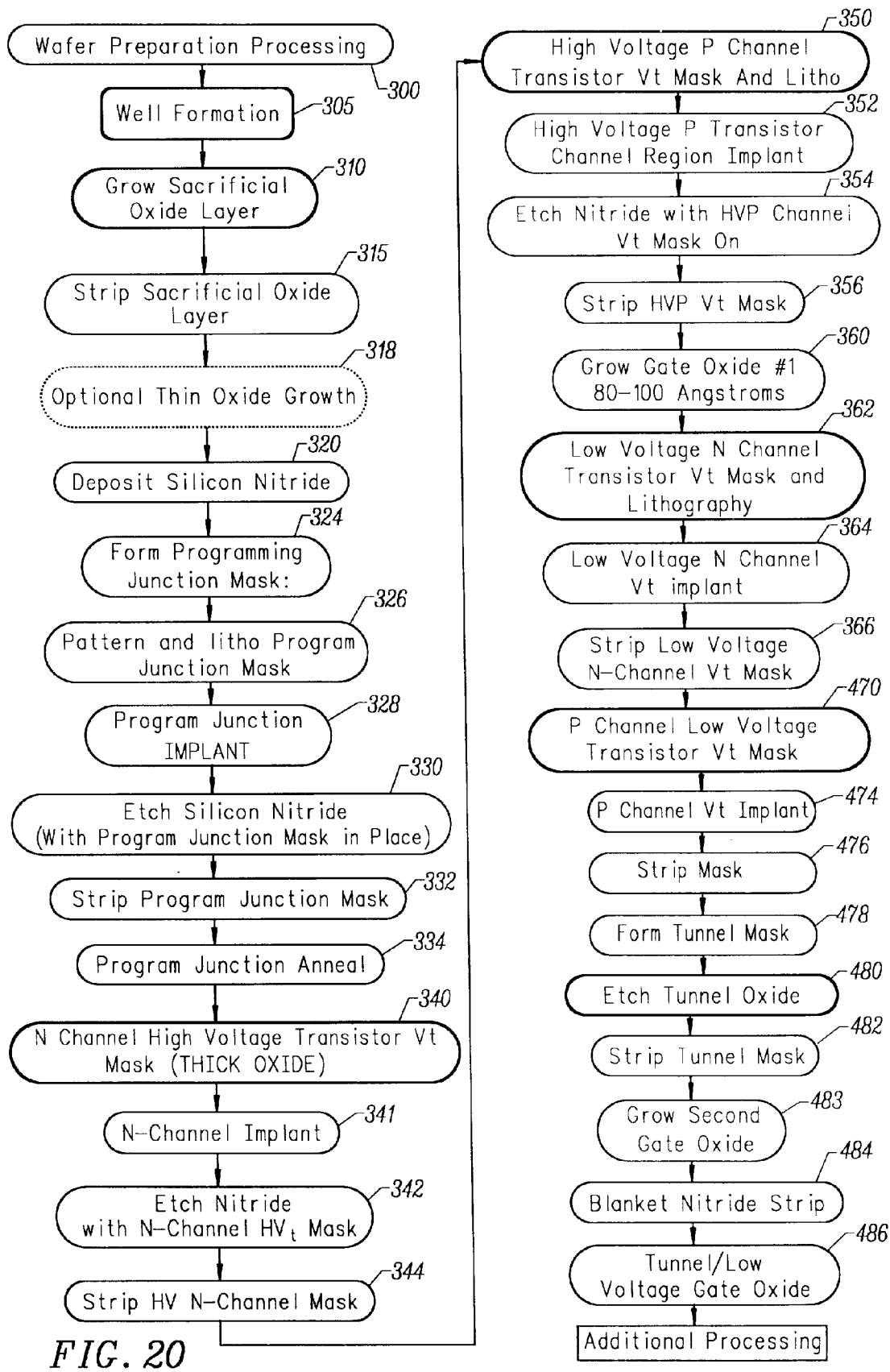
FIG. 20 is a flow diagram of a second alternative embodiment of the present invention.

In a second alternative embodiment of the present invention, shown in FIG. 20, separate masking steps may be utilized to form the tunnel region etch and the low voltage oxide region. This embodiment is more similar to conventional formation of $E^2$ PLD devices in which four separate mask layers are needed (one each for each of the transistor types,) plus an additional tunnel mask layer for the tunnel oxide region. In this embodiment, the process is the same up to the point that the low-voltage N-channel transistor mask is stripped. At step 470 a low-voltage P-channel transistor mask is formed and P-channel implant performed at step 474. The mask is stripped at step 476 and a separate tunnel mask formed at step 478. The oxide layer is formed at step 483. The tunnel oxide layer is etched at step 480 and tunnel mask stripped at step 482. The blanket nitride strip and additional oxidation proceeds as in the first embodiment.

It should be understood that additional processing steps will be necessary to complete formation of the CMOS $E^2$ PLD device, such process steps being generally known to one of average skill in the art. Such techniques can comprise, by way of example, standard CMOS transistor formation processes, including: polysilicon deposition, pattern and etching; poly re-oxidation; NLDD masking and implant steps, PLDD masking and implant steps, sidewall formation; n+ and p+ source/drain region formation and annealing; interconnect formation; and contact (metal) formation.

The many features and advantages of the present invention will be apparent to one of average skill in the art. For example, the specific processes set forth herein for implementing the implantation, etching and formation steps may be altered within the scope of the present invention. Each of the processes is given herein by way of example and without limitation. All such features and advantages are intended to be within the scope of the invention as defined by the disclosure and as reflected in the following claims.

What is claimed is:

1. A process for forming multiple oxide layers on a semiconductor substrate, wherein the substrate is to have an $E^2$ PLD CMOS device having high voltage N-channel, high voltage P-channel, low voltage N-channel, and low voltage P-channel transistors, comprising the steps of:

(a) depositing a layer of nitride on the surface of the semiconductor substrate;

(b) etching a first and second portions of the nitride layer;

(c) forming a first and second regions of a first oxide layer on the substrate in the first and second etched portions of the nitride layer;

(d) etching the first region of the oxide;

(e) forming a second oxide layer on the substrate having a first portion in the first etched portion of the nitride and a second portion overlying the first portion of the second region of the first oxide layer;

(f) removing the nitride layer; and (g) forming a third layer of oxide having a first portion on the surface of the substrate, a second and third portions on the first and second portions of the second oxide layer.

2. The method of claim 1 wherein, subsequent to step (a), the method further includes the step of: forming a program junction mask, and patterning the mask to expose said first and second portions of the silicon nitride layer.

3. The method of claim 1 wherein subsequent to step (c), the method further includes the step of forming a low voltage transistor threshold channel mask layer having at least a first opening over the first region of the oxide and a second opening.

4. A method for forming oxide regions having multiple thicknesses, comprising:

(a) providing a semiconductor substrate having a surface;

(b) forming a nitride layer on the surface;

(c) forming a first mask layer on the surface of the substrate, the mask layer having a first and second windows formed therein;

(d) etching the nitride layer in the first and second windows;

(e) forming a second mask layer on the surface of the nitride having at least one window formed therein;

(f) etching the nitride exposed in the window of the second mask layer;

(g) growing a first oxide layer in the etched portions of the nitride layer;

(h) forming a third mask layer on the surface of the substrate, the third mask layer having a first window being located at substantially the same position as the first window of the first mask layer and a second window;

(i) etching the oxide in the first window of the third mask layer;

(j) growing a second oxide layer on the surface of the substrate exposed in the first window, and on the surface of the first oxide layer;

(k) removing the nitride layer; and (l) growing a third oxide layer on the surface of the substrate, the first oxide layer and the second oxide layer, thereby yielding oxide regions having a first thickness, a second thickness and a third thickness.

5. The method of claim 4 wherein the method further includes the step, prior to step (b), of:

forming a thin oxide layer on the surface of the substrate.

6. The method of claim 4 wherein the method further includes the step, subsequent to step (c), of:

implanting a first and second program junction regions into the substrate through said first and second windows, respectively.

7. The method of claim 4 wherein said method further includes the steps, subsequent to step (e), of:

implanting a transistor channel region through said at least one window, the channel region being of a first conductivity type.

8. The method of claim 4 further including the step, subsequent to step (g), of:

forming a fourth mask layer on the surface of the nitride having at least one window formed therein;

forming a transistor channel region by implanting a dopant of a second conductivity type through said at least one window;

etching the nitride exposed in the window of the fourth mask layer.

9. The method of claim 4 wherein the third mask layer is a combination tunnel region and transistor threshold mask layer.

10. The method of claim 4 wherein the method further includes the step, subsequent to step (h), of:
implanting a low voltage transistor channel region through the second window of the third mask layer.

11. The method of claim 4 wherein the first oxide layer has a thickness of 30–150 Å.

12. The method of claim 4 wherein the second oxide layer has a thickness of 20–80 Å.

13. The method of claim 4 wherein the third oxide layer has a thickness of 20–80 Å.

14. A process for forming multiple oxide regions on a semiconductor substrate having a surface, comprising:
(a) forming a layer of silicon nitride on the surface;
(b) forming a programming junction mask layer;
(c) implanting program junctions into the substrate;
(d) etching the silicon nitride on portions of the surface overlying the programming junctions;
(e) forming a high voltage N-channel transistor threshold mask layer;
(f) implanting a dopant to form a high voltage N-channel;
(g) etching the silicon nitride on portions of the surface overlying the N-channel transistor threshold implant;
(h) forming a high voltage P-Channel transistor threshold mask layer;
(i) implanting a dopant to form a high voltage P-channel;
(j) etching the silicon nitride on portions of the surface overlying the P-channel transistor threshold implant;
(k) forming a first oxide layer having a first thickness on the portions of the surface where the silicon nitride has been etched;
(l) forming a low voltage transistor channel threshold mask layer for a transistor of a first conductivity type;
(m) implanting a dopant to form a low voltage transistor channel region of said first conductivity type;
(n) forming a combination low voltage transistor channel threshold and tunnel region mask layer having an opening over one of the program junction regions;
(o) etching the first oxide layer in the program junction region;
(p) implanting a dopant to form a low voltage transistor channel region of a second conductivity type;
(q) forming a second oxide layer on the surface of the substrate and the surface of the first oxide layer;
(r) stripping the silicon nitride layer; and
(s) forming a third oxide layer of a third thickness on the surface of the substrate and the surface of the second oxide layer.

15. The method of claim 14 wherein said step (a) comprises heating the substrate in a nitrogen-containing atmosphere.

16. The method of claim 14 wherein said step (c) comprises implanting an N+ dopant material into the substrate.

17. The method of claim 14 wherein said step (c) comprises implanting a first program junction region from which a tunneling oxide will be formed, and a second program junction region upon which a control gate oxide will be formed.

18. The method of claim 14 wherein said step (b) comprises the sub-steps of:

depositing a mask layer;
patterning the mask layer to expose windows overlying the areas where the program junctions are to be formed in the substrate.

19. The method of claim 14 further comprising the step, subsequent to step (d), of removing the program junction mask layer.

20. The method of claim 14 wherein said step (e) comprises:
depositing an N-channel transistor threshold mask layer; and
patterning the N-channel transistor threshold mask layer to provide windows overlying portions of the surface where a high-voltage N-channel is to be formed.

21. The method of claim 14 wherein said step (f) comprises implanting boron at an energy of 20 KeV at a dose of $1.9 \times 10^{12}$ cm$^{-2}$.

22. The method of claim 14 wherein, subsequent to step (g), the method further includes the sub-step of:
removing the high-voltage N-channel transistor threshold mask layer.

23. The method of claim 14 wherein said step (h) comprises:
forming a P-channel transistor threshold mask layer; and
patterning the high-voltage P-channel transistor threshold mask layer to provide windows overlying portions of the surface under which a P-channel is to be formed.

24. The method of claim 14 wherein, subsequent to step (j), the method further includes the step of:
removing a high-voltage P-channel transistor threshold mask layer.

25. The method of claim 14 wherein said step (i) comprises implanting phosphorous at an energy of 55 KeV at a dose of $4.0 \times 10^{11}$ cm$^{-2}$.

26. The method of claim 14 wherein said step (m) comprises implanting Boron at an energy of 20 KeV at a dose of $6.2 \times 10^{12}$ cm$^{-2}$.

27. The method of claim 14 wherein the first conductivity type is an N-type.

28. The method of claim 14 wherein the second conductivity type is a P-type.

29. The method of claim 14 wherein said step (p) comprises implanting phosphorous at an energy of 55 KeV at a dose of $5.9 \times 10^{12}$ cm$^{-2}$.

30. The method of claim 14 wherein said step (k) comprises heating a substrate in an oxygen-filled atmosphere to provide an oxide layer having a thickness of approximately 30–150 Å.

31. The method of claim 14 wherein said step (q) comprises heating the substrate in an oxygen-filled atmosphere to form an oxide layer having a thickness of about 20–80 Å.

32. The method of claim 14 wherein said step (s) comprises heating the substrate in an oxygen-filled atmosphere to form a third oxide layer having a thickness of about 20–80 Å.

33. The method of claim 14 wherein said step (q) provides the second oxide layer overlying the first oxide layer having a combined thickness of approximately 150 Å.

34. A method for forming an $E^2$ PLD device, comprising:
(a) depositing a silicon nitride layer;
(b) forming a programming junction mask layer patterned with at least a first and second windows to expose at least a first and second regions of the nitride layer;
(c) implanting first and second program junction regions;
(d) etching the first and second regions of the silicon nitride;

(e) removing the program junction mask;
(f) forming a high voltage n-channel transistor mask with at least a third window exposing a third portion of the silicon nitride layer;
(g) implanting an n-channel region into the substrate through the third window;
(h) etching the third portion of the silicon nitride layer;
(i) removing the high voltage n-channel transistor mask;
(j) forming a high voltage p-channel transistor mask with at least a fourth window exposing a fourth portion of the silicon nitride layer;
(k) implanting an p-channel region into the substrate through the fourth window;
(l) etching the fourth portion of the silicon nitride layer;
(m) removing the high voltage n-channel transistor mask;
(n) growing a first gate oxide in the first, second, third and fourth portions of the etched silicon nitride layer;
(o) forming a low voltage n-channel transistor mask having at least a fifth window exposing a fifth portion of the silicon nitride layer;
(p) implanting an n-channel region into the substrate through the fifth window;
(q) removing the low voltage n-channel transistor mask;
(r) forming a low voltage p-channel transistor mask having at least a sixth window exposing a sixth portion of the silicon nitride layer and at least a seventh window exposing the first portion of the first gate oxide;
(s) etching the first portion of the first gate oxide;
(t) implanting a p-channel region into the substrate through the seventh window;
(u) removing the low voltage p-channel transistor mask;
(v) forming a second oxide layer on the substrate in the first portion of the etch silicon nitride layer, and on the first gate oxide in the second, third and fourth portions of the etched silicon nitride layer;
(w) removing the silicon nitride layer; and
(x) forming a third oxide layer on the surface of the substrate, on the surface of the second gate oxide.

* * * * *